(12) United States Patent
Dip et al.

(10) Patent No.: US 7,358,194 B2
(45) Date of Patent: Apr. 15, 2008

(54) SEQUENTIAL DEPOSITION PROCESS FOR FORMING SI-CONTAINING FILMS

(75) Inventors: Anthony Dip, Cedar Creek, TX (US);
Allen John Leith, Austin, TX (US);
Seungho Oh, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 398 days.

(21) Appl. No.: 11/206,199

(22) Filed: Aug. 18, 2005

(65) Prior Publication Data

US 2007/0042570 A1    Feb. 22, 2007

(51) Int. Cl.
*H01L 21/302* (2006.01)
*H01L 21/461* (2006.01)

(52) U.S. Cl. .................. 438/719; 257/E21.356

(58) Field of Classification Search .............. 438/719; 257/E21.356
See application file for complete search history.

(56) References Cited

U.S. PATENT DOCUMENTS 4,625,224 A * 11/1986 Nakagawa et al. ........... 257/64

| 2003/0143328 | A1 | 7/2003 | Chen et al. | |
| 2004/0152287 | A1* | 8/2004 | Sherrill et al. | 438/485 |
| 2004/0175893 | A1* | 9/2004 | Vatus et al. | 438/300 |
| 2005/0066892 | A1 | 3/2005 | Dip et al. | |
| 2005/0184348 | A1* | 8/2005 | Youn et al. | 257/401 |
| 2006/0021570 | A1* | 2/2006 | Hasebe et al. | 118/697 |

* cited by examiner

*Primary Examiner*—Asok Kumar Sarkar
(74) *Attorney, Agent, or Firm*—Oblon, Spivak, McClelland, Maier & Neustadt, P.C.

(57) ABSTRACT

A method is provided for forming a Si film in sequential deposition process. The method includes providing a substrate in a process chamber, forming a chlorinated Si film by exposing the substrate to a chlorinated silane gas, and dry etching the chlorinated Si film to reduce the chlorine content of the Si film. The Si film may be deposited selectively or non-selectively on the substrate and the deposition may be self-limiting or non-self-limiting. Other embodiments provide a method for forming SiGe films in a sequential deposition process.

31 Claims, 8 Drawing Sheets

SEQUENTIAL DEPOSITION PROCESS FOR FORMING SI-CONTAINING FILMS

CROSS REFERENCE TO RELATED APPLICATIONS

The present invention is related to U.S. patent application Ser. No. 10/673,375, titled "DEPOSITION OF SILICON-CONTAINING FILMS FROM HEXACHLORODISILANE" the entire content of which is hereby incorporated herein by reference.

FIELD OF THE INVENTION

The present invention relates to semiconductor processing, and more particularly, to forming Si and SiGe films on a substrate

BACKGROUND OF THE INVENTION

Silicon-containing films are used for a wide variety of applications in the semiconductor industry. Silicon-containing films include silicon films such as epitaxial silicon, polycrystalline silicon (poly-Si), and amorphous silicon, epitaxial silicon germanium (SiGe), silicon germanium carbide (SiGeC), silicon carbide (SiC), silicon nitride (SiN), silicon carbonitride (SiCN), and silicon carboxide (SiCO). As circuit geometries shrink to ever smaller feature sizes, lower deposition temperatures for Si-containing films may be preferred, for example because of introduction of new materials into semiconductor devices and reduction of thermal budgets of shallow implants in source and drain regions. It is also evident that non-selective (blanket) and selective deposition of Si-containing films will be needed for future devices.

Epitaxial deposition is a process where the crystal lattice of the bulk substrate is extended through deposition of a new film that may have a different doping level than the bulk. Accordingly, a surface of a single crystal Si (SiGe) substrate or film is required for depositing an epitaxial Si (SiGe) film thereon. Prior to depositing a Si-containing film on a substrate, for example epitaxial Si or epitaxial SiGe films, it may be required to remove a native oxide layer from the surface of the substrate in order to prepare a proper starting growth surface (i.e., a seed layer) to deposit a high quality epitaxial film. Moreover in epitaxial deposition, matching target epitaxial film thickness and resistivity parameters are important for the subsequent fabrication of properly functioning devices.

Silane ($SiH_4$) is commonly used for depositing Si and other Si-containing films. However, substrate temperatures greater than about 700° C. are often needed for achieving deposition rates that are suitable for manufacturing of integrated circuits. Thus, use of silane is undesirable in processes having a low thermal budget. Co-pending U.S. patent application Ser. No. 10/673,375 suggests using chlorinated silane gases to increase deposition rates and, therefore, reduce required deposition temperatures.

SUMMARY OF THE INVENTION

Accordingly, one object of the present invention is to address any of the above described or other problems associated with deposition of silicon containing films.

Another object of the invention is to address problems associated with formation of Si-containing films as a result of requirements for reduced thermal budgets and the need for films with improved properties.

According to an embodiment of the invention, a method is provided for forming a Si film on a substrate. The method includes providing the substrate in a process chamber, depositing a chlorinated Si film by exposing the substrate to a chlorinated silane gas, and dry etching the chlorinated Si film to reduce the chlorine content of the Si film. The deposition and dry etching steps may be repeated to form a Si film with a desired thickness.

According to another embodiment of the invention, a method is provided including providing the substrate in a process chamber, and depositing a chlorinated film by exposing the substrate to a chlorinated gas containing a component of the film to be deposited. Also included is dry etching the chlorinated film to reduce the chlorine content of the film, wherein the component comprises at least one of Si and Ge. The deposition and dry etching steps may be repeated to form a SiGe film with a desired thickness.

According to yet another embodiment of the invention, a method is provided including providing the substrate in a process chamber, and selectively depositing a chlorinated SiGe film by exposing the substrate to a silane gas and a germane gas. At least one of the silane gas and germane gas is chlorinated. The method also includes dry etching the chlorinated SiGe film to reduce the chlorine content of the SiGe film.

The deposition and dry etching steps may be repeated to form a SiGe film with a desired thickness.

According to embodiments of the invention, the Si-containing films can include Si and SiGe films. The Si-containing films may be deposited selectively or non-selectively on a substrate and the deposition may be self-limiting or non-self-limiting.

DETAILED DESCRIPTION OF SEVERAL EMBODIMENTS OF THE INVENTION

Figure 1:
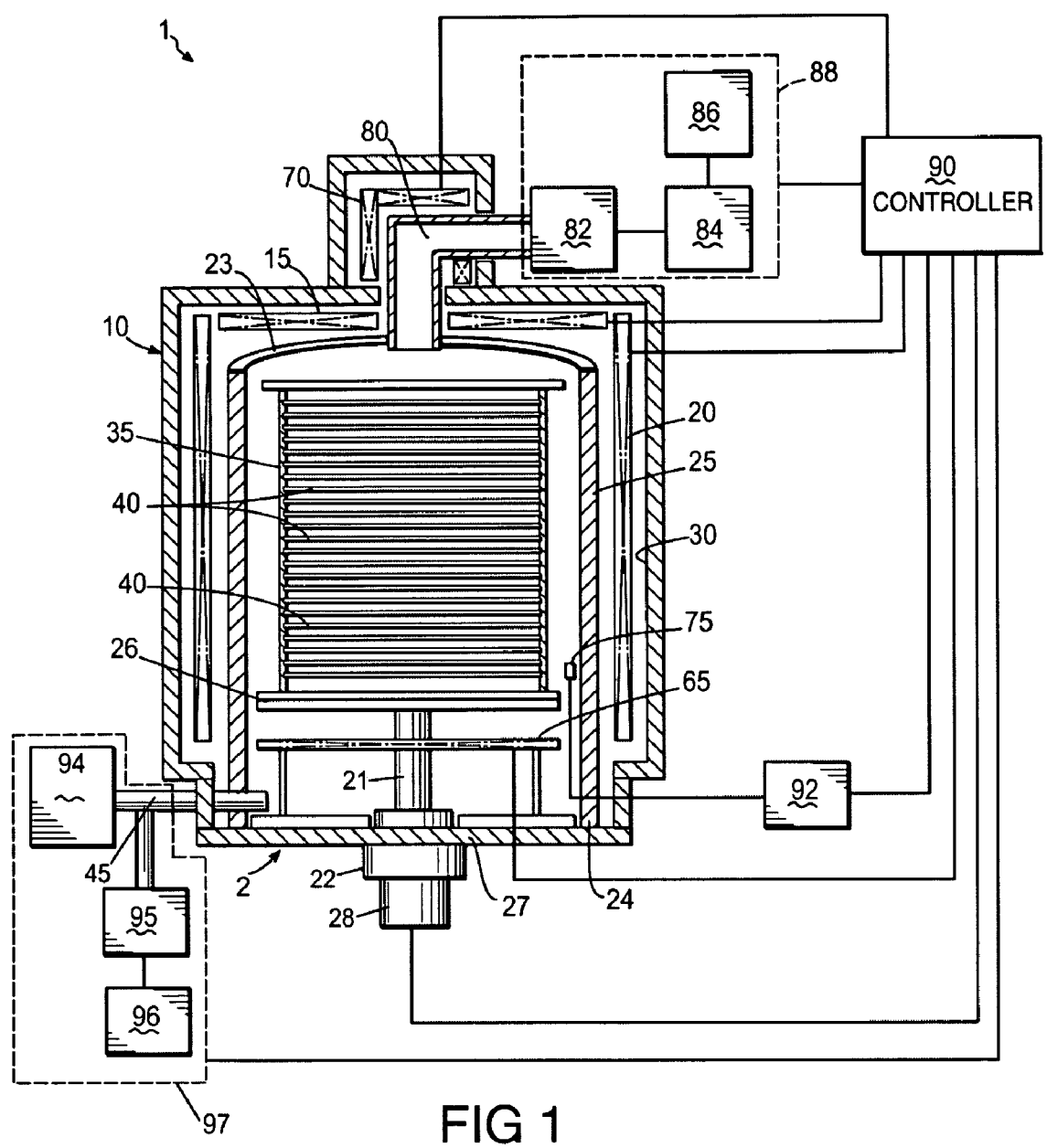
FIG. 1 shows a simplified block diagram of a batch processing system according to an embodiment of the invention.

As described in the Background section above, using $SiH_4$ for selectively depositing Si-containing films requires high substrate temperatures to achieve manufacturable deposition rates, and such high temperatures are undesirable or unacceptable for thermal budgets of current and future processes. As also discussed, co-pending U.S. patent application Ser. No. 10/673,375, titled "DEPOSITION OF SILICON-CONTAINING FILMS FROM HEXACHLORO- DISILANE", describes the use of $Si_2Cl_6$ (HCD) gas to deposit Si-containing films at lower substrate temperatures than needed when using $SiH_4$. Since Si deposition rates are higher for $Si_2Cl_6$ than for $SiH_4$ at a given substrate temperature, this allows for increased selectivity for depositing Si films on Si surfaces while avoiding deposition on other materials such as $SiO_2$ or SiN dielectric materials. The increased deposition rate and longer incubation time for $Si_2Cl_6$, allows for growing a thicker epitaxial Si film on a Si surface before deposition starts on other materials on the substrate.

However, the present inventors have determined that use of a chlorinated silane gas to deposit an Si containing film can cause contamination problems that affect the Si film and/or the deposition process. Specifically, using chlorinated silane gas can cause chlorine contamination of the film that alters film characteristics such as resistivity of the deposited film. Moreover, as deposition temperatures are decreased to meet thermal budgets, chlorine contamination becomes a greater problem. Indeed, at low temperatures, chlorine may occupy substantially all of the deposited film surface area such that additional Si cannot be continuously grown. That is, use of a chlorinated silane gas at low temperatures can cause the deposition process to be self limiting. For example, low substrate temperatures can result in incomplete decomposition of the chlorinated silane gas on the substrate. The low substrate temperature can further hinder chlorine liberation from the substrate, thereby resulting in a self-limited deposition of a chlorinated Si film. At higher substrate temperatures, the chlorinated silane gas may completely decompose on the substrate and the higher substrate temperature aid in the liberation of chlorine from the substrate, thereby result in non-self-limiting deposition of a Si film.

The present inventors have recognized that these chlorine contamination problems can hinder the use of chlorinated silane gas processes for depositing pure Si films and for low temperature deposition. Such chlorine contamination can cause similar problems with germane films. Based on these recognitions, the present inventors discovered that the chlorine content in Si or Ge films can be reduced by a dry etching process which enables greater flexibility in the use of chlorinated silane or germane to deposit pure Si or germane films, and to deposit Si or germane films at low temperature. The dry etching process liberates chlorine from the chlorinated film, thereby effectively reducing the chlorine content of the film.

In the following description, in order to facilitate a thorough understanding of the invention and for purposes of explanation and not limitation, specific details are set forth, such as a particular geometry of the batch processing system and descriptions of various components. However, it should be understood that the invention may be practiced in other embodiments that depart from these specific details. In particular, embodiments of the invention provide a method for selectively and non-selectively forming Si-containing films on different materials on a substrate in a sequential deposition process. The Si-containing films include epitaxial Si films and epitaxial SiGe films that are deposited from a chlorinated silane gas, and a chlorinated germane gas or germane gas, respectively. The deposition of the Si-containing films can be self-limiting, where the film deposition saturates and stops automatically, or non-self-limiting, where the film deposition does not saturate but continues until the process is stopped by the operator.

Referring now to the drawings, FIG. 1 shows a simplified block diagram of a batch processing system according to an embodiment of the invention. The batch processing system 1 contains a process chamber 10 and a process tube 25 that has an upper end 23 connected to an exhaust pipe 80, and a lower end 24 hermetically joined to a lid 27 of cylindrical manifold 2. The exhaust pipe 80 discharges gases from the process tube 25 to a vacuum pumping system 88 to maintain a pre-determined atmospheric or below atmospheric pressure in the processing system 1. A substrate holder 35 for holding a plurality of substrates (wafers) 40 in a tier-like manner (in respective horizontal planes at vertical intervals) is placed in the process tube 25. The substrate holder 35 resides on a turntable 26 that is mounted on a rotating shaft 21 penetrating the lid 27 and driven by a motor 28. The turntable 26 can be rotated during processing to improve overall film uniformity or, alternately, the turntable can be stationary during processing. The lid 27 is mounted on an elevator 22 for transferring the substrate holder 35 in and out of the process tube 25. When the lid 27 is positioned at its uppermost position, the lid 27 is adapted to close the open end of the manifold 2.

A gas delivery system 97 is configured for introducing gases into the process chamber 10. A plurality of gas supply lines can be arranged around the manifold 2 to supply a plurality of gases into the process tube 25 through the gas supply lines. In FIG. 1, only one gas supply line 45 among the plurality of gas supply lines is shown. The gas supply line 45 shown, is connected to a first gas source 94. In general, the first gas source 94 can supply gases for processing the substrates 40, including gases for forming films (e.g., silicon-containing gases for depositing silicon-containing films) onto the substrates 40, or an etching gas for dry etching the substrates 40.

In addition, or in the alternate, one or more of the gases can be supplied from the (remote) plasma source 95 that is operatively coupled to a second gas source 96 and to the process chamber 10 by the gas supply line 45. The plasma-excited gas is introduced into the process tube 25 by the gas supply line 45. The plasma source 95 can, for example, be a microwave plasma source, a radio frequency (RF) plasma source, or a plasma source powered by light radiation. In the case of a microwave plasma source, the microwave power can be between about 500 Watts (W) and about 5,000 W. The microwave frequency can, for example, be 2.45 GHz or 8.3 GHz. In one example, the remote plasma source can be a Downstream Plasma Source Type AX7610, manufactured by MKS Instruments, Wilmington, Mass., USA.

A cylindrical heat reflector 30 is disposed so as to cover the reaction tube 25. The heat reflector 30 has a mirror-finished inner surface to suppress dissipation of radiation heat radiated by main heater 20, bottom heater 65, top heater 15, and exhaust pipe heater 70. A helical cooling water passage (not shown) can be formed in the wall of the process chamber 10 as a cooling medium passage. The heaters 20, 65, and 15 can, for example, maintain the temperature of the substrates 40 between about 20° C. and about 900° C.

The vacuum pumping system 88 comprises a vacuum pump 86, a trap 84, and automatic pressure controller (APC) 82. The vacuum pump 86 can, for example, include a dry vacuum pump capable of a pumping speed up to 20,000 liters per second (and greater). During processing, gases can be introduced into the process chamber 10 via the gas supply line 45 of the gas delivery system 97 and the process pressure can be adjusted by the APC 82. The trap 84 can collect unreacted precursor material and by-products from the process chamber 10.

The process monitoring system 92 comprises a sensor 75 capable of real-time process monitoring and can, for example, include a mass spectrometer (MS), a FTIR spectrometer, or a particle counter. A controller 90 includes a microprocessor, a memory, and a digital I/O port capable of generating control voltages sufficient to communicate and activate inputs to the processing system 1 as well as monitor outputs from the processing system 1. Moreover, the controller 90 is coupled to and can exchange information with gas delivery system 97, motor 28, process monitoring system 92, heaters 20, 15, 65, and 70, and vacuum pumping system 88. The controller 90 may be implemented as a DELL PRECISION WORKSTATION 610™. The controller 90 may also be implemented as a general purpose computer, processor, digital signal processor, etc., which causes a substrate processing apparatus to perform a portion or all of the processing steps of the invention in response to the controller 90 executing one or more sequences of one or more instructions contained in a computer readable medium. The computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

The controller 90 may be locally located relative to the processing system 1, or it may be remotely located relative to the processing system 1 via an internet or intranet. Thus, the controller 90 can exchange data with the processing system 1 using at least one of a direct connection, an intranet, and the internet. The controller 90 may be coupled to an intranet at a customer site (i.e., a device maker, etc.), or coupled to an intranet at a vendor site (i.e., an equipment manufacturer). Furthermore, another computer (i.e., controller, server, etc.) can access controller 90 to exchange data via at least one of a direct connection, an intranet, and the internet.

It is to be understood that the batch processing system 1 depicted in FIG. 1 is shown for exemplary purposes only, as many variations of the specific hardware can be used to practice the present invention, and these variations will be readily apparent to one having ordinary skill in the art. The processing system 1 in FIG. 1 can, for example, process substrates of any size, such as 200 mm substrates, 300 mm substrates, or even larger substrates. Furthermore, the processing system 1 can simultaneously process up to about 200 substrates, or more. Alternately, the processing system 1 can simultaneously process up to about 25 substrates.

Figure 2:
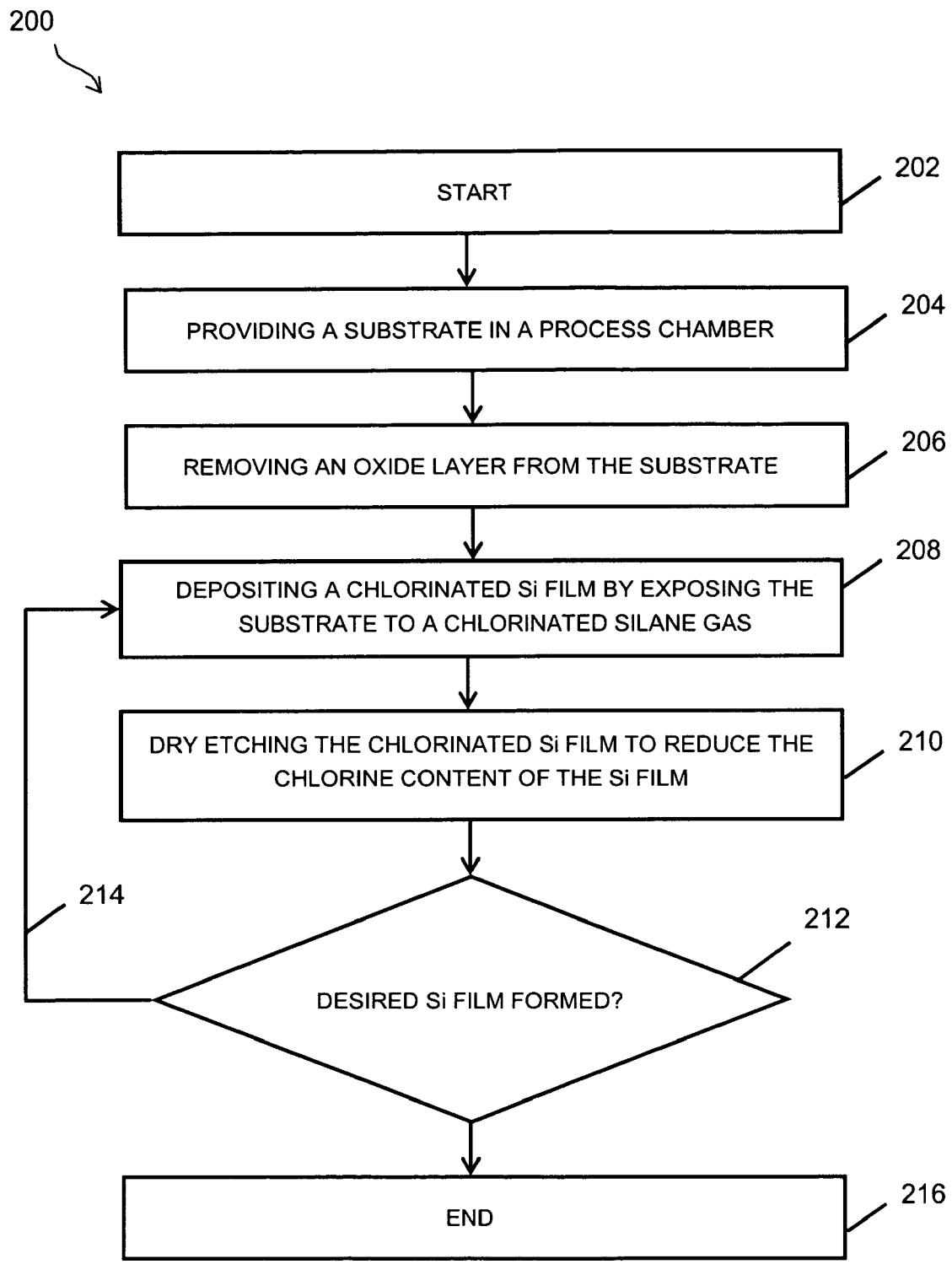
FIG. 2 is a flow diagram for forming a Si film on a substrate by a sequential deposition process according to an embodiment of the invention.

Reference will now be made to FIG. 2 and FIG. 4. FIG. 2 is a flow diagram for forming a Si film on a substrate by a sequential deposition process according to an embodiment of the invention. FIGS. 4A-4E schematically show formation of a Si film on a substrate according to an embodiment of the invention. In FIG. 2, the process 200 starts at 202. In step 204 a substrate 410 is provided in a process chamber. The process chamber can, for example, be the process chamber 10 of the batch processing system 1 depicted in FIG. 1. Alternatively, the processing system can be a single wafer processing system. The substrate can, for example, contain Si, SiGe, SiGeC, SiC, SiN, SiCN, SiCO, Ge, can be a glass substrate, a LCD substrate, or a compound semiconductor substrate, and can include numerous active devices and/or isolation regions. Furthermore, the substrate can be a patterned substrate and contain vias or trenches or combinations thereof.

Figure 4A:
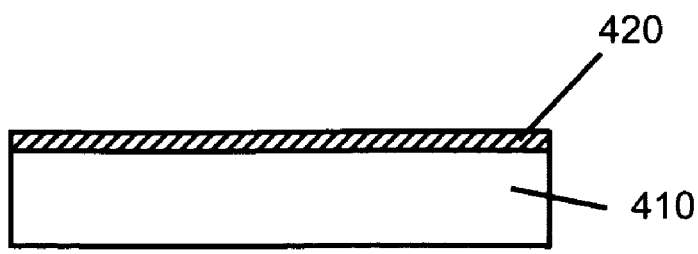
FIGS. 4A-4E schematically show formation of a Si film on a substrate according to an embodiment of the invention.
Figure 4B:
Figure 4C:
Figure 4D:

The substrate 410 depicted in FIG. 4A contains an oxide layer 420 formed thereon. The oxide layer 420 is removed from the substrate 410 in step 206. Removal of the oxide layer 420, and any other surface contamination, creates a clean substrate surface that enables subsequent deposition of an epitaxial Si containing film such as Si or SiGe films on the substrate surface where the crystal lattice of the bulk substrate is extended through growth of the new film. The oxide layer 420 may be a native oxide layer that forms easily on Si substrates when exposed to air, even at room temperature. In addition to inhibiting proper film seeding and epitaxial film growth, the presence of the oxide layer 420 can also reduce deposition selectivity on different substrate materials. Alternately, the step 206 may be omitted from the process 200 if, for example, the substrate 410 is clean when provided in the process chamber or if deposition of an epitaxial film is not desired. Exemplary methods and systems for removing an oxide layer from a substrate are described in co-pending U.S. patent application Ser. No. 11/094,462, titled "A METHOD AND SYSTEM FOR REMOVING AN OXIDE FROM A SURFACE", and 11/xxx,xxx titled "A METHOD AND SYSTEM FOR REMOVING AN OXIDE FROM A SURFACE USING FLUORINE" filed on Aug. 18, 2005 and having Attorney Docket No. 273849US, and the entire contents of both of these applications is hereby incorporated herein by reference.

In step 208, a chlorinated Si film 430 is deposited on the substrate 410 by exposing the substrate to a chlorinated silane gas. In one example, the chlorinated Si film 430 in FIG. 4C may be a single layer of chlorine terminated Si atoms that are bonded to the substrate 410. In other examples, the chlorinated Si film 430 may be several atomic layers thick and contain a chlorine terminated Si layer. In addition or in the alternative, the film 430 may have a chlorine distribution within the film 430. Embodiments of the invention are not limited to these examples, as chlorinated Si films having other chlorine distributions are contemplated. The chlorinated silane gas can contain $SiCl_4$, $SiHCl_3$, $SiH_2Cl_2$, $SiH_3Cl$, or $Si_2Cl_6$, or a combination of two or more thereof. The chlorinated silane gas can further contain inert gas, $Cl_2$, $H_2$, HCl, or H, or a combination of two or more thereof. The inert gas can contain $N_2$ or a noble gas (e.g., Ar).

As noted above, the dry etching step of the present invention can reduce chlorine content of the Si film. Thus, the substrate temperature during deposition can be selected in consideration of the overall thermal budget, the desired deposition rate, or the crystal structure of the deposited film (e.g., single crystal, polycrystalline, or amorphous). The substrate temperature can be between about 300° C. and about 700° C. According to one embodiment of the invention, the substrate temperature can be between about 400° C. and about 600° C., or between about 550° C. and about 650° C.

As also noted above, deposition of the chlorinated Si film 430 can be performed under processing conditions where the process is self-limiting. In one example, approximately one atomic layer of chlorine terminated Si is deposited in deposition step 208 and the deposition stops automatically due to the self-limiting properties of the chlorine terminated Si. This self limiting property can provide precise control of film thickness, which may be beneficial. Alternately, deposition of the chlorinated Si film 430 can be non-self-limiting (continuous) where multiple atomic layers of Si are deposited in the deposition step 208 until the exposure is stopped by the operator. A non-self-limiting deposition process is commonly referred to as a chemical vapor deposition (CVD) process. In one example, substrate temperature can be utilized to achieve self-limiting or non-self-limiting deposition conditions.

In step 210, a dry etching process is performed to reduce the chlorine content of the chlorinated Si film 430. The dry etching process liberates chlorine from the chlorinated Si film 430, thereby effectively reducing the chlorine content of the Si film 430. The dry etching process can be performed by exposure to an etching gas comprising $F_2$, $Cl_2$, $H_2$, HCl, or H, or a combination of two or more thereof. The etching gas can further contain an inert gas such as $N_2$ or a noble gas (e.g., Ar). The inert gas can be used to control the concentration of the Cl, H etchants in the etching gas. The dry etching process is carried out for a time period that results in the desired chlorine removal and formation of a Si film 432 (see FIG. 4D). In addition to liberating chlorine, the dry etching process may also etch away Si from the chlorinated Si film 430.

Figure 4E:
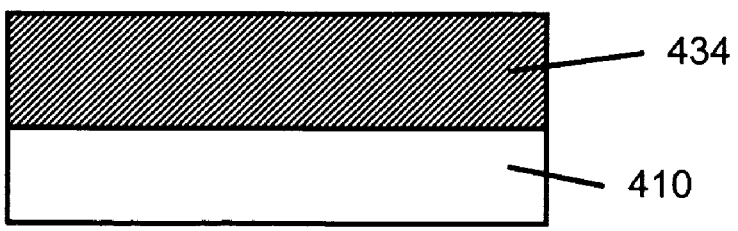

Although not shown in FIG. 2, purging steps may be performed in between two or more steps of the process 200. For example, the process chamber may be purged after the oxide removal step 206, after step 208 to remove the chlorinated silane gas and reaction by-products from the process chamber, and after step 210 to remove the etching gas and etch by-products from the process chamber. The purge gas can, for example, contain $H_2$ and/or an inert gas such as $N_2$ or a noble gas. In one example, $H_2$ may be used in step 208 and/or in step 210 and as a purging gas between steps 208 and 210. Furthermore, one or more of the purge steps may be replaced or complimented with pump down steps where no purge gas is flowed. If a desired Si film has not been formed in step 210, a decision is made in step 212 to repeat at least once the depositing step 208 and the dry etching step 210, as shown by the process flow step 214, or, if the desired Si film has been formed, to end the process in step 216. Thus, the steps 208 and 210 may be repeated at least once to build up a Si film with a desired thickness. FIG. 4E schematically shows a thick Si film 434 following multiple deposition and dry etch steps. The thickness of the Si film 434 can, for example, be between about 10 nm and about 20 nm, but this is not required for embodiments of the invention.

In one example, the time duration of each deposition step 208 and dry etching step 210 can be of the order of about one minute and the length of each purge step can be of the order of about 30 seconds. However, the time durations used are expected to vary depending on the substrate temperature, process chamber pressure, and gas composition.

The Si films 432 and 434 may be doped by adding a dopant gas to the chlorinated silane gas, the dry etching gas, or the purge gas. The dopant gas can, for example, contain $PH_3$, $AsH_3$, $B_2H_6$, or $BCl_3$, to dope the Si films 432, 434 with P, As, or B, respectively. In one example, a dopant gas may a replace $H_2$ as a purge gas. It is contemplated that a sufficiently long exposure of a dopant gas will result in a highly doped Si film that can, for example, be used for raised source/drain applications. In general, doping concentration less than saturation can be achieved by controlling the exposure time to a dopant gas.

According to an embodiment of the invention, the Si films 432, 434 can be selectively formed on an exposed Si surface of the substrate 410. The Si films 432, 434 can, for example, be epitaxial Si, poly-Si, or amorphous Si. In one example, since Si deposition rates are higher for $Si_2Cl_6$ than for $SiH_4$ at a given substrate temperature, this allows for increased selectivity for depositing Si films on Si surfaces while avoiding deposition on other materials such as $SiO_2$ or SiN dielectric materials. The increase in deposition rates and difference in incubation time, allows for growing a thicker epitaxial Si film on a Si surface before deposition starts on other materials. Alternately, the Si films 432, 434 may be non-selectively formed on the various substrate materials.

Figure 3A:
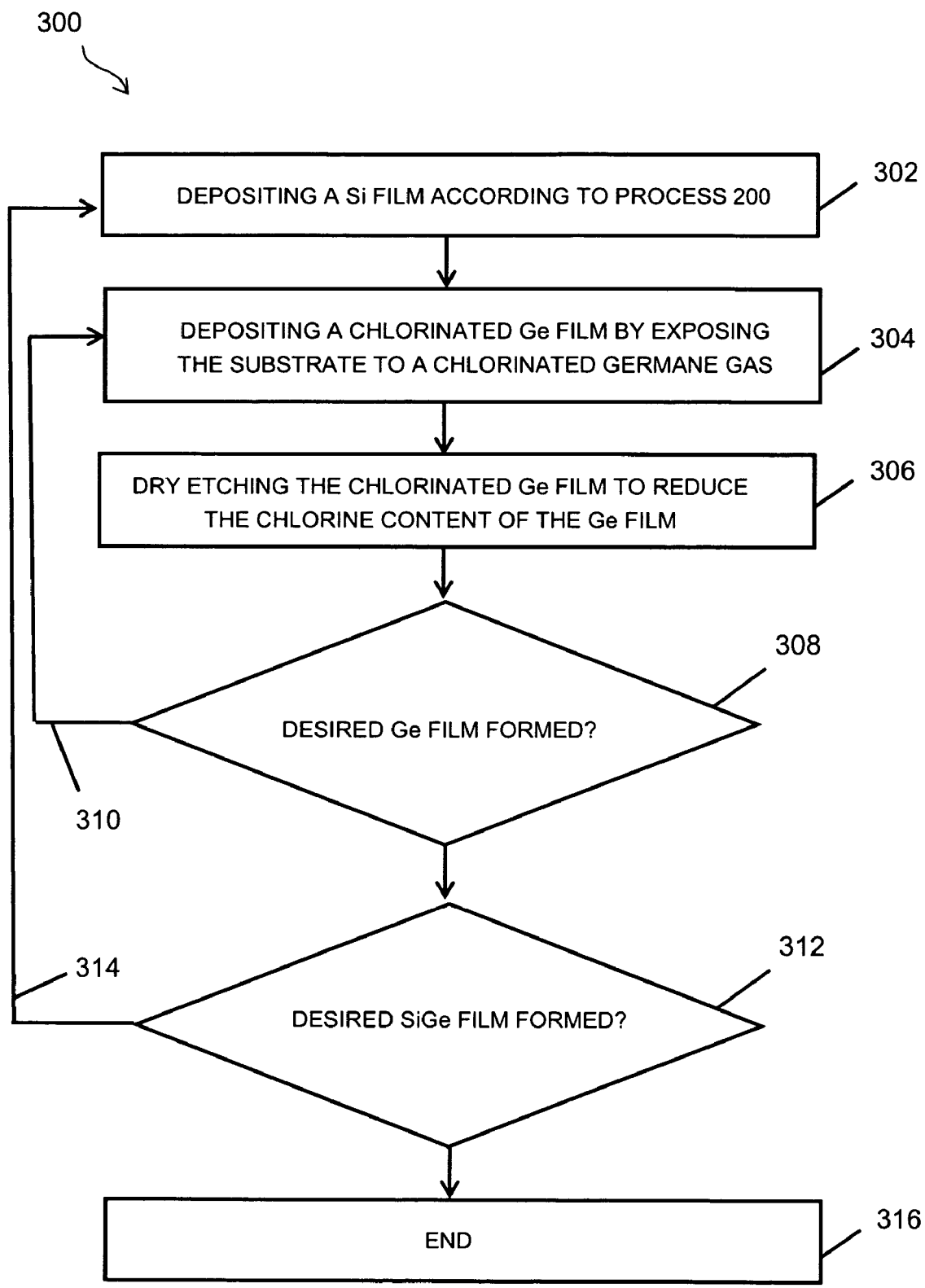
FIGS. 3A and 3B are flow diagrams for forming a SiGe film on a substrate by a sequential deposition process according to embodiments of the invention.

Reference is now made to FIGS. 3A, 4, and 5. FIG. 3A is a flow diagram for depositing a SiGe film on a substrate using a sequential deposition process according to an embodiment of the invention. FIGS. 4A-4C and FIGS. 5A-5D schematically show formation of a SiGe film on a substrate according to an embodiment of the invention.

The process 300 includes at 302 the steps of the process 200 shown in FIG. 2 for forming a Si film. In addition, the process 300 includes, at 304, depositing a chlorinated Ge film 510 on the Si film 432 by exposing the substrate to a chlorinated germane gas. As with the chlorinated Si film 430 described in FIG. 4C, the chlorinated Ge film 510 in FIG. 5B may be a single layer of chlorine terminated Ge atoms that are bonded to the Si layer 432. In other examples, the chlorinated Ge film 510 may be several atomic layer thick and contain a chlorine terminated Ge layer. In addition or in the alternative, the several atomic layer thick film 510 may have a chlorine distribution within the film 510. Embodiments of the invention are not limited to these examples, as chlorinated Ge films having other chlorine distributions are contemplated.

The chlorinated germane gas can contain $GeCl_4$, $GeHCl_3$, $GeH_2Cl_2$, $GeH_3Cl$, or $Ge_2Cl_6$, or a combination of two or more thereof. The chlorinated germane gas can further contain inert gas, $Cl_2$, $H_2$, HCl, or H, or a combination of two or more thereof. The inert gas can contain $N_2$ or a noble gas (e.g., Ar). As with the deposition of a chlorinated Si film 430 described above, the substrate temperature for depositing the chlorinated Ge film 510 can be selected in consideration of the overall thermal budget, the desired deposition rate, and the crystal structure of the deposited film (e.g., single crystal, polycrystalline, or amorphous). The substrate temperature can be between about 300° C. and about 700° C. According to one embodiment of the invention, the substrate temperature can be between about 400° C. and about 600° C., or between about 550° C. and about 650° C.

Deposition of the chlorinated Ge film 510 can be performed under processing conditions where the process is self-limiting. In one example, approximately one atomic layer of Ge is deposited in deposition step 304 and the deposition stops automatically due to formation of the chlorinated Ge layer. Alternately, the Ge deposition can be a non-self-limiting (continuous) where multiple atomic layers of Ge are deposited until the exposure is stopped by the operator. In one example, substrate temperature can be utilized to choose self-limiting or non-self-limiting deposition conditions.

In step 306, a dry etching process is performed to reduce the chlorine content of the chlorinated Ge film 510. The dry etching process liberates chlorine from the chlorinated Ge film 510, thereby effectively reducing the chlorine content of the Ge film 430. The dry etching process can be performed by exposure to an etching gas containing $F_2$, $Cl_2$, $H_2$, HCl, or H, or a combination of two or more thereof. The etching gas can further contain an inert gas such as $N_2$ or a noble gas (e.g., Ar). The inert gas can be used to control the concentration of the Cl, H etchants in the etching gas. The dry etching process is carried out for a time period that results in the desired chlorine removal and formation of a Ge film 512 (see FIG. 5C). Although the SiGe film 520 is depicted as a Si film 432 and a Ge film 512, those skilled in the art will recognize that a well-defined boundary between the two films may not be present.

Although not shown in FIG. 3A, purging steps may be performed in between two or more steps of the process 300. For example, the process chamber may be purged after step 304 to remove the chlorinated germane gas and reaction by-products from the process chamber, and after step 306 to remove the dry etching gas and etch by-products from the process chamber. The purge gas can, for example, contain $H_2$ and an inert gas such as $N_2$ and/or a noble gas. In one example, $H_2$ may be used in step 304 and/or in step 306 and as a purging gas between steps 304 and 306. Furthermore, one or more of the purge steps may be replaced or complimented with pump down steps where no purge gas is flowed.

Figure 5A:
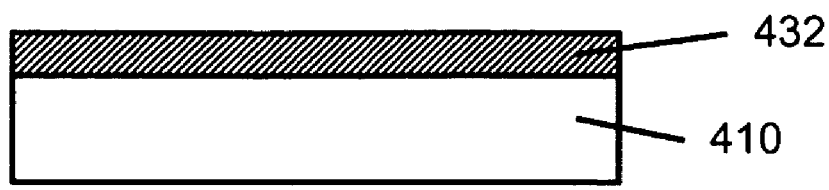
FIGS. 5A-5D schematically show formation of a SiGe film on a substrate according to an embodiment of the invention.
Figure 5B:
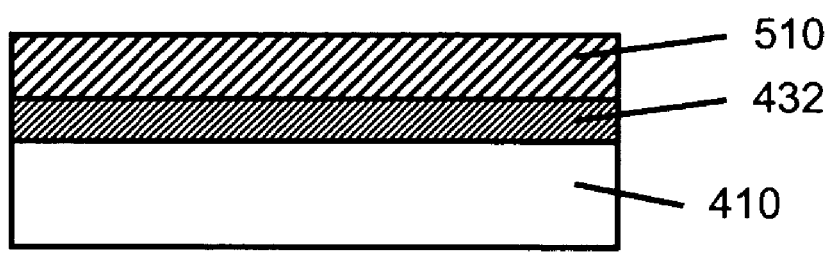
Figure 5C:
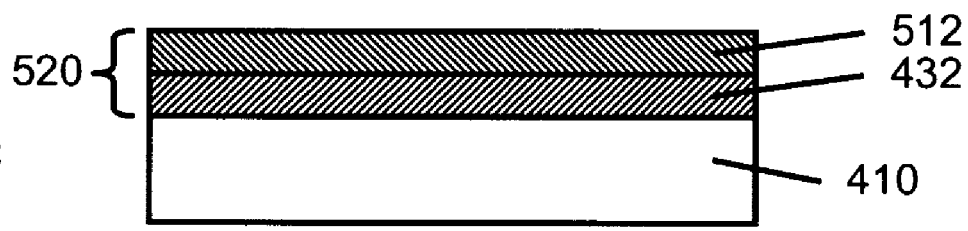
Figure 5D:
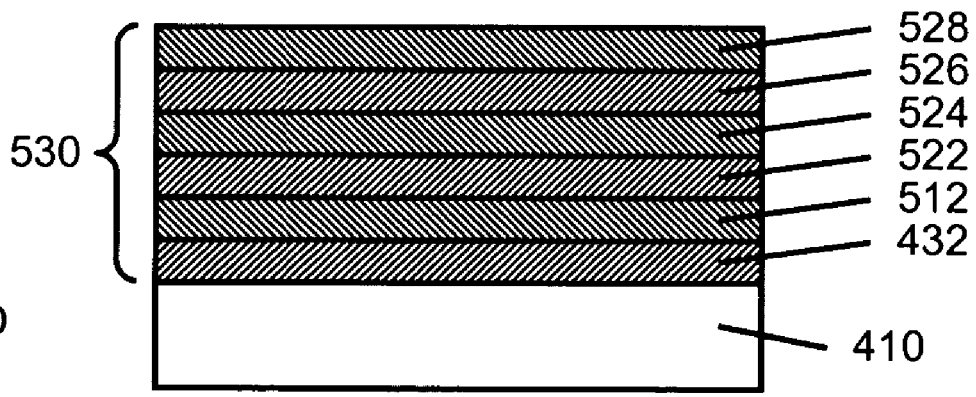

If a desired Ge film has not been formed in step 306, a decision is made in step 308 to repeat at least once the depositing step 304 and dry etching step 306, as shown by the process flow step 310. If the desired Ge film has been formed, in step 312 a decision is made to repeat at least once the deposition of the Si and Ge films, as shown by the process flow step 314, or to end the process in step 316. Thus, the deposition/dry etch steps of the process 300 may be repeated to build up a SiGe film with a desired thickness. FIG. 5D schematically shows a thick SiGe film 530 following multiple deposition and dry etch process steps. The exemplary SiGe film 530 contains Si layers 432, 522, 526, and Ge layers 512, 524, 528. The thickness of the SiGe film 530 can, for example, be between about 1 nm and about 100 nm. In another example, the thickness can be between about 10 nm and about 70 nm, but this is not required for embodiments of the invention. As described above for SiGe film 520, although the SiGe film 530 is depicted as a discrete Si and Ge films, a well-defined boundary between the films may not be present.

In one example, the time duration of each exposure step 304 and dry etching step 306 can be of the order of about one minute and the length of each purge step can be of the order of about 30 seconds. However, the time durations used are expected to vary depending on the substrate temperature, process chamber pressure, and gas composition.

The SiGe films depicted in FIG. 5 may be doped by adding a dopant gas to the chlorinated germane gas, the etching gas, or a purge gas. The dopant gas can, for example, contain $PH_3$, $AsH_3$, $B_2H_6$, or $BCl_3$, to dope the Si film with P, As, or B, respectively. In one example, a dopant gas may a replace $H_2$ as a purge gas. It is contemplated that a sufficiently long exposure of a dopant gas will result in a highly doped SiGe film that can, for example, be used for raised source/drain applications. In general, doping concentration less than saturation can be achieved by controlling the exposure time to a dopant gas.

According to an embodiment of the invention, the SiGe films 520, 530 can be selectively formed on an exposed SiGe surface of the substrate 410. The SiGe films 520, 530 can, for example, be epitaxial SiGe, poly-SiGe, or amorphous SiGe. Alternately, the SiGe films 520, 530 maybe non-selectively formed on the various substrate materials.

The process 300 in FIG. 3A shows deposition of a Si film and subsequently deposition of a Ge film on the Si film to form a SiGe film. As will be readily appreciated by those skilled in the art, the order of the deposition steps may be reversed by first depositing a Ge film and subsequently deposit a Si film on the Ge film to form a SiGe film.

According to an embodiment of the invention, germane gas ($GeH_4$) may be added to the chlorinated germane gas in step 304. According to another embodiment, $GeH_4$ may replace the chlorinated germane gas in step 304 to deposit a Ge layer and the dry etching step 306 omitted. However, the use of $GeH_4$ can reduce the selectivity of the Ge deposition due to the presence of H on the substrate surface from the decomposition of $GeH_4$. In addition, the presence of H on the substrate surface during film deposition can hinder the formation of chlorine terminated layers for self-limiting deposition.

Figure 3B:
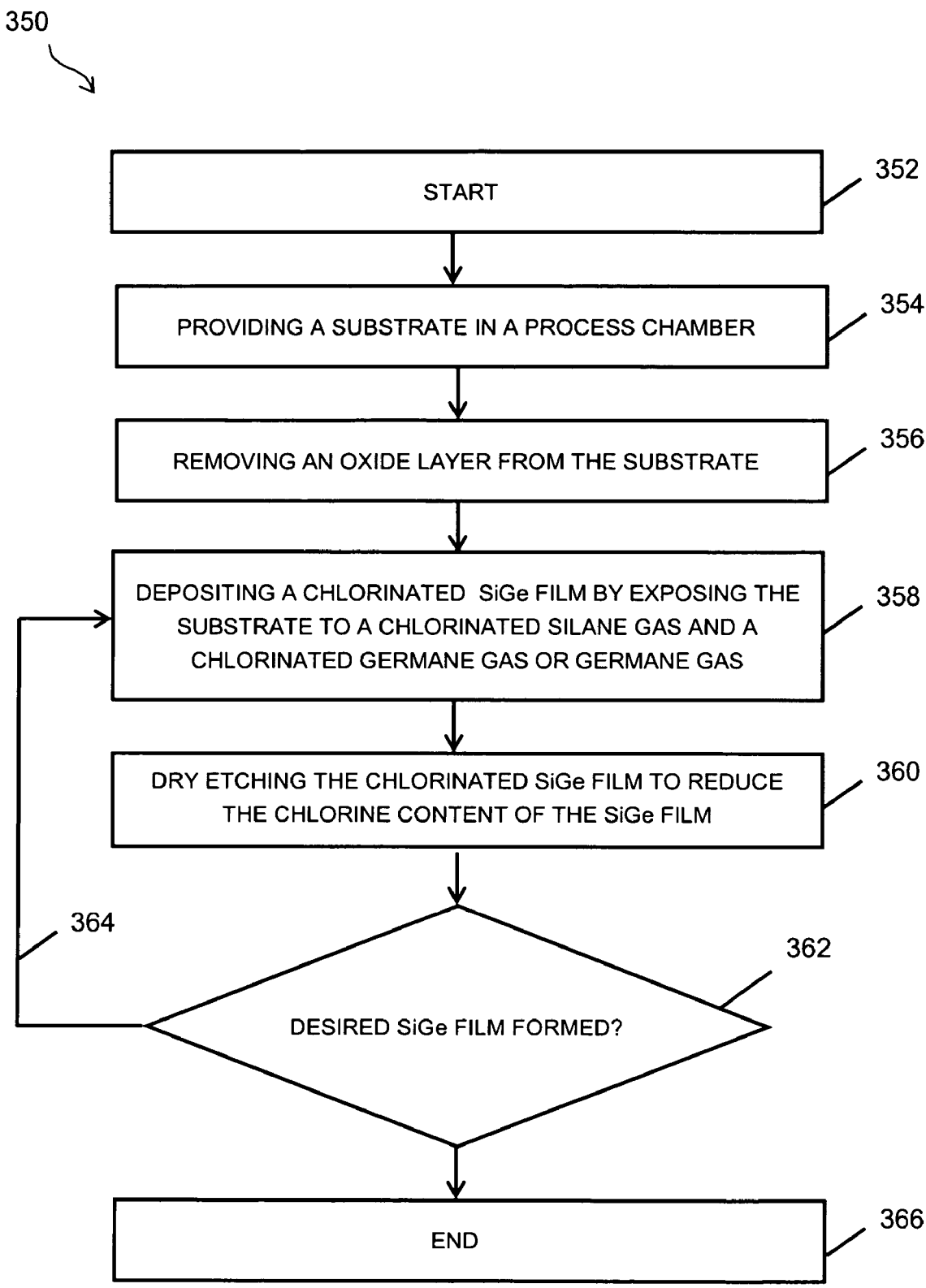

FIG. 3B is a flow diagram for depositing a SiGe film on a substrate by a sequential deposition process according to an embodiment of the invention. Steps 352, 354, 356 correspond to steps 302, 304, 306 of FIG. 3A and have been described above. In step 358, a chlorinated SiGe film is deposited by exposing a substrate to a chlorinated silane gas in combination with a chlorinated germane gas and/or germane gas. In step 360, the chlorinated SiGe film is dry etched to reduce the chlorine content of the SiGe film. The dry etching step 360 may be performed as described above for Si and Ge films.

If a desired SiGe film has not been formed in step 360, a decision is made in step 362 to repeat at least once the depositing step 358 and dry etching step 360, as shown by the process flow step 364, or, if the desired SiGe film has been formed, to end the process in step 366. Thus, the steps 358 and 360 may be repeated at least once to build up a SiGe film with a desired thickness.

Figure 6A:
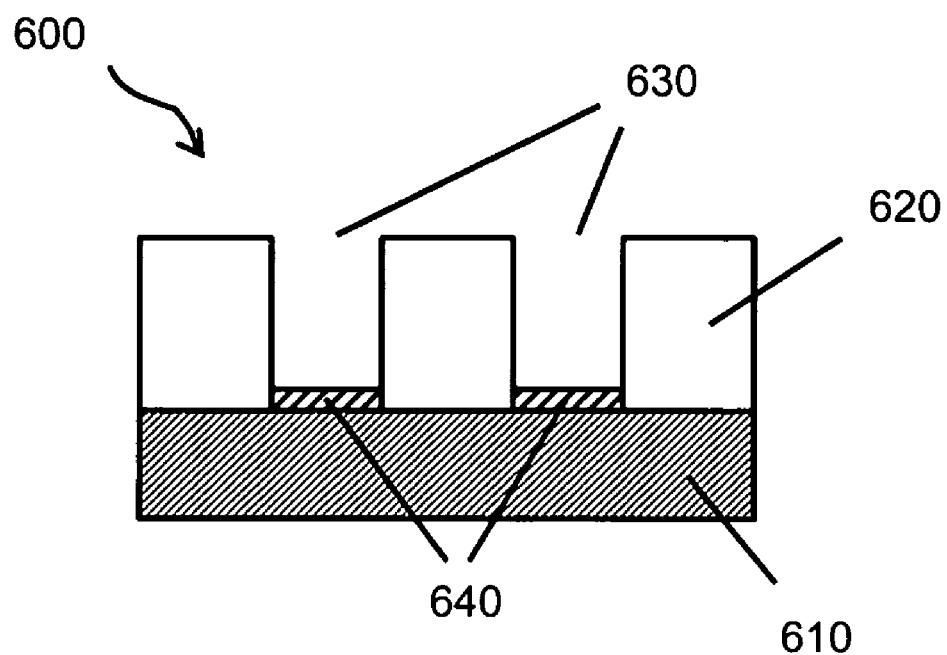
FIGS. 6A-6D schematically show formation of a Si-containing film on a patterned structure according to an embodiment of the invention.

FIGS. 6A-6D schematically show formation of a Si-containing film on a patterned structure according to an embodiment of the invention. FIG. 6A shows a patterned structure 600 containing a substrate 610, a patterned film 620, and oxide layers 640 formed on the substrate 610 in the openings 630. Although not shown in FIG. 6A, surfaces of the patterned film 620 may also contain an oxide layer or other surface contaminants. The patterned film 620 can, for example, be a dielectric film such as a $SiO_2$ film, a SiON film, a low-k film, or a high-k film. The openings 630 can, for example, be vias or trenches, or combinations thereof. The patterned structure 600 is an exemplary structure used in the device manufacturing and can contain a silicon substrate 610 and an overlying photolithographically patterned film 620.

Thus, FIGS. 2, 3A and 3B describe a method for improved processing of a substrate by etching a chlorinated Si film to reduce a chlorine content of the Si film. As described in these figures, a preferred embodiment of the invention performs the etching step sequentially after a film is deposited. However, it is to be understood that there may be overlap between deposition and etching steps of FIGS. 2, 3A and 3B.

Figure 6B:
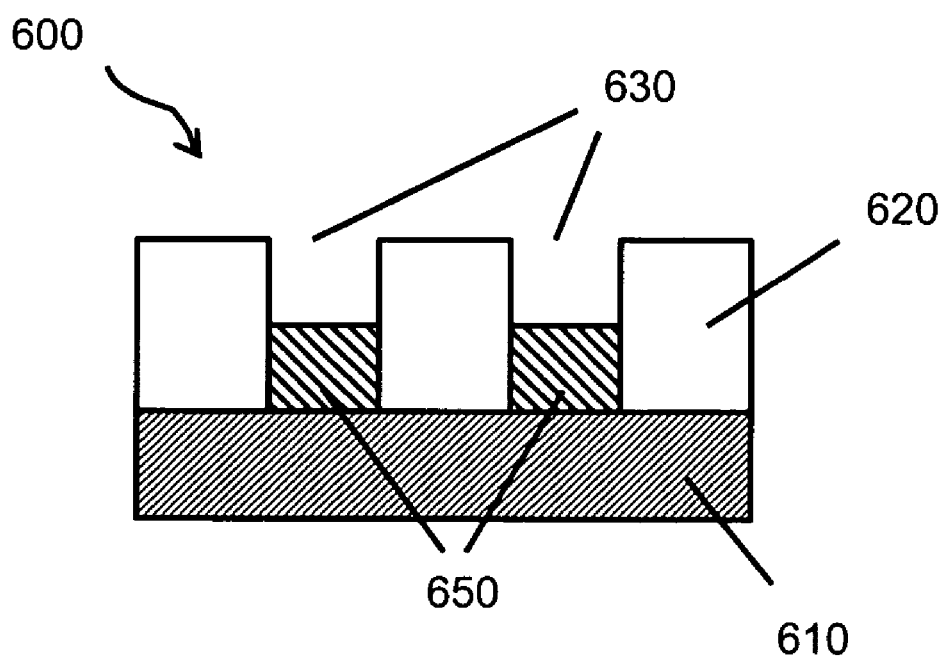

FIG. 6B shows the patterned structure 600 following removal of the oxide layers 640 from the openings 630 and selective deposition of a chlorinated film 650 onto the exposed portions of the substrate 610 according to embodiments of the invention. The selectively deposited film 650 can, for example, be an epitaxial Si film deposited on a Si substrate 610 or an epitaxial SiGe film deposited on a SiGe surface 610. An epitaxial Si film 650 can, for example, be selectively deposited on the exposed portion of the silicon substrate 610, using a gas containing $Si_2Cl_6$, at a substrate temperature between about 300° C. and about 700° C. The substrate temperature may, for example, be selected in view of the thermal budget of the device being manufactured. In one example, the substrate temperature may be between about 650° C. and about 700° C. for device technologies with relatively high thermal budgets. In another example, the substrate temperature may be between about 550° C. and about 650° C. for device technologies having minimum feature sizes ranging from 65 nm to 90 nm. In yet another example, the substrate temperature may be between about 300° C. and about 550° C. for device technologies having minimum feature sizes smaller than 65 nm.

Figure 6C:
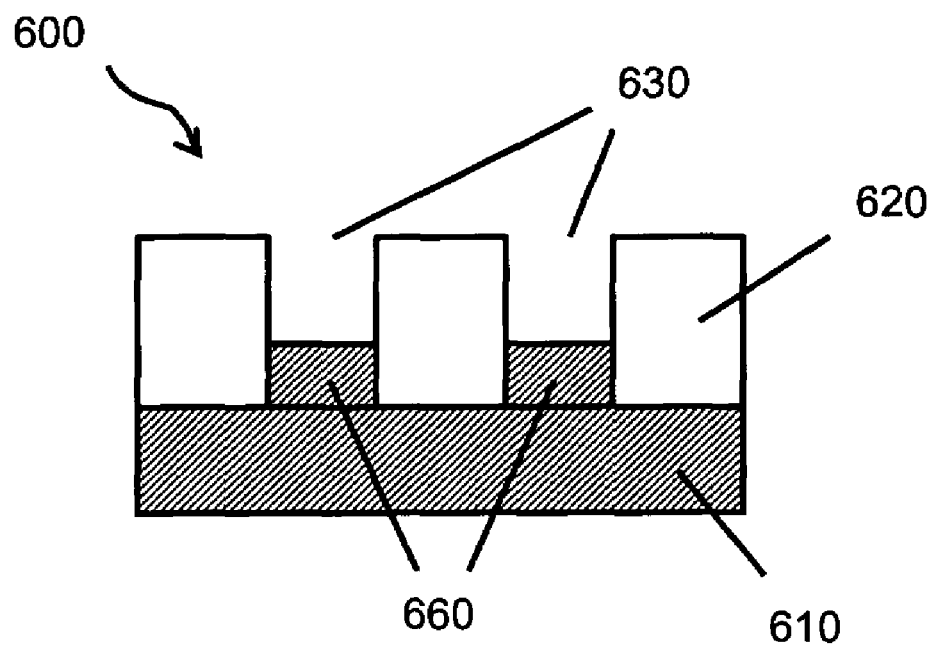

FIG. 6C shows the patterned structure 600 following a dry etching process. The dry etching process forms an epitaxial Si (SiGe) film 660 with reduced chlorine content. Examples of a dry etching process are described above for Si, Ge, and SiGe films.

The selective deposition of the epitaxial film 660 allows for subsequent removal of the patterned film 620 from the substrate 610 using methods known to those skilled in the art, to form a raised epitaxial Si or SiGe film 660 on the substrate 610. The use of selective deposition of epitaxial silicon-containing films can be used for manufacturing silicon-on-insulator (SOI) devices with a raised source and drain regions. During SOI device fabrication, processing may consume an entire Si film in source and drain regions, thereby requiring extra Si in these regions that can be provided by selective epitaxial growth (SEG) of Si films. Selective epitaxial deposition of Si films can reduce the number of photolithography and etch steps that are needed, which can reduce the overall cost and complexity involved in manufacturing a device.

Figure 6D:
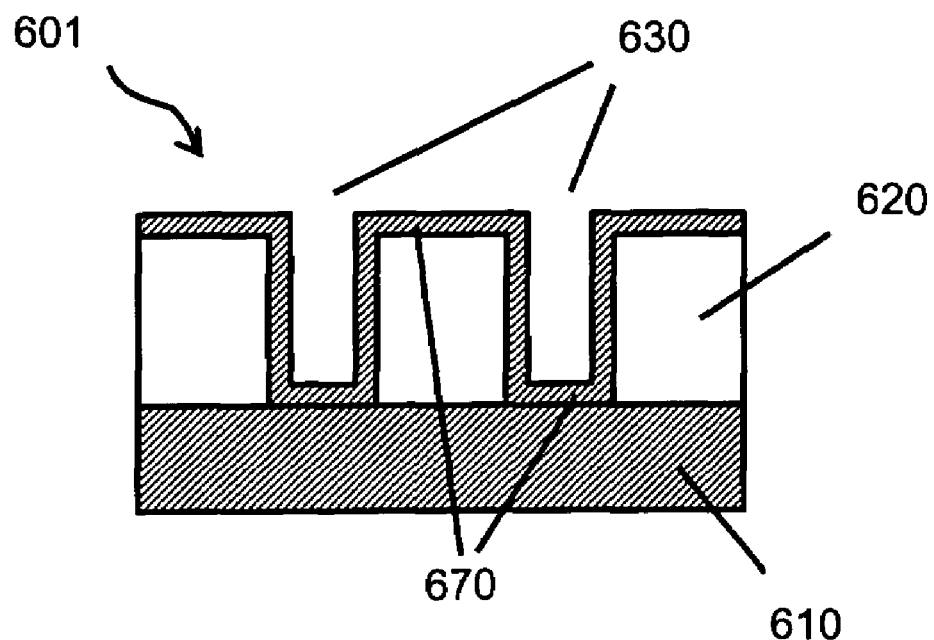

FIG. 6D shows a patterned structure 601 following non-selective (blanket) deposition of a film 670 onto the patterned structure 601 according to an embodiment of the invention. According to one embodiment of the invention, the film 670 can be a Si film or a SiGe film. The film 670 can be deposited on the patterned structure 601 using the sequential deposition process described in embodiments of the invention. The film 67 can have a substantially uniform thickness, regardless of the type of materials comprising the substrate 610 and the patterned film 620. In one example, a Si film 670 can be formed on the patterned structure 601 using a process gas containing $Si_2Cl_6$, a substrate temperature between about 550° C. and about 700° C. In another example, a process gas containing $Si_2Cl_6$ and $SiH_4$ may be used. As would be appreciated by those skilled in the art, the crystal structure of the deposited Si films can be a function of processing conditions, including substrate temperature, process pressure, and gas composition.

In one embodiment of the invention, a non-selective deposition process may be performed where selective deposition is not possible or not feasible. One example is formation of a highly doped gate electrode in contact with gate dielectric material (e.g., $SiO_2$) of a CMOS device, where the substrate has no exposed Si regions. In one example, a SiGe gate electrode may be deposited instead of the conventional poly-Si gate electrode and $Si_2Cl_6$ may be used in combination with germane gas or chlorinated germane gas for the SiGe deposition. Due to the higher deposition rate of $Si_2Cl_6$ than the conventionally used silane, $Si_2Cl_6$ is more compatible with germane gas or chlorinated germane gas since the germane-containing gases have a significantly lower deposition temperature than silane. In one example, an amorphous SiGe film with a desired Ge concentration may be deposited at lower temperature and wider range of compositions than is achievable using silane and germane.

Although only certain embodiments of this invention have been described in detail above, those skilled in the art will readily appreciate that many modifications are possible in the exemplary embodiment without materially departing from the novel teachings and advantages of this invention. Accordingly, all such modifications are intended to be included within the scope of this invention.

What is claimed is:

1. A method of processing a substrate, comprising:
   providing the substrate in a process chamber;
   depositing a chlorinated Si film by exposing the substrate to a chlorinated silane gas; and
   dry etching the chlorinated Si film to reduce the chlorine content of the Si film.

2. The method according to claim 1, further comprising:
   repeating the depositing and dry etching steps at least once.

3. The method according to claim 1, wherein the chlorinated silane gas comprises $SiCl_4$, $SiHCl_3$, $SiH_2Cl_2$, $SiH_3Cl$, or $Si_2Cl_6$, or a combination of two or more thereof.

4. The method according to claim 1, wherein the chlorinated silane gas further comprises an inert gas, $Cl_2$, $H_2$, HCl, or H, or a combination of two or more thereof.

5. The method according to claim 1, wherein the dry etching comprises:
   exposing the chlorinated Si film to an etching gas comprising $F_2$, $Cl_2$, $H_2$, HCl, or H, or a combination of two or more thereof.

6. The method according to claim 1, wherein the depositing a chlorinated Si film comprises a self-limiting deposition process.

7. The method according to claim 1, wherein the depositing a chlorinated Si film comprises a non-self-limiting deposition process.

8. The method according to claim 1, further comprising:
   purging the process chamber between the depositing and the dry etching steps.

9. The method according to claim 1, further comprising:
   removing an oxide layer from the substrate prior to the depositing, the removing comprising exposing the substrate to a cleaning gas comprising $F_2$, $Cl_2$, $H_2$, HCl, or H, or a combination of two or more thereof.

10. The method according to claim 1, further comprising:
    depositing a chlorinated Ge film by exposing the substrate to a chlorinated germane gas; and
    dry etching the chlorinated Ge film to reduce the chlorine content of the Ge film.

11. The method according to claim 10, further comprising:
    repeating the depositing a chlorinated Ge film and dry etching the chlorinated Ge film at least once.

12. The method according to claim 10, wherein the dry etching comprises:
    exposing the chlorinated Ge film to an etching gas comprising $F_2$, $Cl_2$, $H_2$, HCl, or H, or a combination of two or more thereof.

13. The method according to claim 10, wherein the depositing a chlorinated Ge film comprises a self-limiting deposition process.

14. The method according to claim 10, wherein the depositing a chlorinated Ge film comprises a non-self-limiting deposition process.

15. The method according to claim 10, wherein the chlorinated germane gas further comprises germane gas.

16. The method according to claim 1, further comprising:
    depositing a Ge film by exposing the substrate to germane gas.

17. The method according to claim 16, further comprising repeating the depositing and dry etching steps at least once.

18. The method according to claim 1, wherein the substrate comprises a silicon-containing material, a glass substrate, a LCD substrate, or a compound semiconductor substrate.

19. The method according to claim 18, wherein the silicon-containing material comprises Si, SiGe, SiGeC, SiC, SiN, SiCN, SiCO, or Ge.

20. The method according to claim 1, wherein the Si film comprises poly-Si, amorphous Si, or epitaxial Si.

21. The method according to claim 1, wherein the substrate is maintained at a temperature between about 300° C. and about 700° C. during the depositing and the dry etching steps.

22. The method according to claim 1, wherein the Si film is selectively formed on an exposed Si surface of the substrate.

23. The method according to claim 1, wherein the Si film is non-selectively formed on the substrate.

24. A method of processing a substrate, comprising:
providing the substrate in a process chamber;
depositing a chlorinated film by exposing the substrate to a chlorinated gas containing a component of the film to be deposited; and
dry etching the chlorinated film to reduce the chlorine content of the film, wherein the component comprises at least one of Si and Ge.

25. The method of claim 24, wherein said depositing comprises depositing said chlorinated film as an Si film by exposing the substrate to $Si_2Cl_6$ gas.

26. The method of claim 24, wherein said depositing comprises depositing said chlorinated film as a Ge film by exposing the substrate to a chlorinated germane gas.

27. The method of claim 24, further comprising removing an oxide layer from the substrate before said depositing.

28. The method of claim 24, further comprising repeating the depositing and dry etching at least once.

29. A method of processing a substrate, comprising:
providing the substrate in a process chamber;
selectively depositing a chlorinated SiGe film by exposing the substrate to a silane gas and a germane gas wherein at least one of the silane gas and germane gas is chlorinated; and
dry etching the chlorinated SiGe film to reduce the chlorine content of the SiGe film.

30. The method of claim 29, further comprising repeating the depositing and dry etching at least once.

31. The method of claim 29, further comprising removing an oxide layer from the substrate before said depositing.

* * * * *